United States Patent
Bin Abdul Aziz et al.

(10) Patent No.: US 11,791,170 B2
(45) Date of Patent: Oct. 17, 2023

(54) UNIVERSAL SEMICONDUCTOR PACKAGE MOLDS

(71) Applicant: TEXAS INSTRUMENTS INCORPORATED, Dallas, TX (US)

(72) Inventors: Anis Fauzi Bin Abdul Aziz, Melaka (MY); Chong Han Lim, Kuala Lumpur (MY); Lee Han Meng@Eugene Lee, Muar (MY); Wei Fen Sueann Lim, Melaka (MY)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 36 days.

(21) Appl. No.: 17/238,151

(22) Filed: Apr. 22, 2021

(65) Prior Publication Data

US 2021/0242038 A1 Aug. 5, 2021

Related U.S. Application Data

(63) Continuation of application No. 16/533,305, filed on Aug. 6, 2019, now abandoned.

(51) Int. Cl.
*H01L 21/56* (2006.01)
*H01L 21/48* (2006.01)
(Continued)

(52) U.S. Cl.
CPC ........ *H01L 21/565* (2013.01); *B29C 33/0022* (2013.01); *B29C 33/44* (2013.01);
(Continued)

(58) Field of Classification Search
CPC .............................. H01L 21/561; H01L 21/565
See application file for complete search history.

(56) References Cited

U.S. PATENT DOCUMENTS

| 4,298,883 A | 11/1981 | Komatsu et al. |
| 4,971,196 A | 11/1990 | Kitamura et al. |

(Continued)

FOREIGN PATENT DOCUMENTS

| CN | 203792581 U | * 8/2014 | ............. B29C 33/00 |
| CN | 207432667 U | * 6/2018 | ............. B29C 45/17 |

(Continued)

OTHER PUBLICATIONS

Machine translation, Hong, Korean Pat. Pub. No. KR 100521977B1, translation date: Sep. 22, 2022, Espacenet, all pages. (Year: 2022).*

(Continued)

*Primary Examiner* — Victoria K. Hall
(74) *Attorney, Agent, or Firm* — Dawn Jos; Frank D. Cimino

(57) ABSTRACT

A method of making semiconductor packages includes providing a first lead frame having a first plurality of semiconductor dies arranged along a first longitudinal axis, each of the first plurality of semiconductor dies having a first number of metal contacts; providing a second lead frame having a second plurality of semiconductor dies arranged along a second longitudinal axis, each of the second plurality of semiconductor dies having a second number of metal contacts, the second number of metal contacts different than the first number of metal contacts; and covering the first plurality of semiconductor dies in a first mold using a common semiconductor die cavity; covering the second plurality of semiconductor dies in a second mold using the common semiconductor die cavity.

16 Claims, 19 Drawing Sheets

(51) Int. Cl.
  *H01L 23/495* (2006.01)
  *H01L 23/31* (2006.01)
  *B29C 45/14* (2006.01)
  *B29C 33/44* (2006.01)
  *B29C 33/00* (2006.01)

(52) U.S. Cl.
  CPC .... *B29C 45/14467* (2013.01); *H01L 21/4821* (2013.01); *H01L 21/561* (2013.01); *H01L 23/3107* (2013.01); *H01L 23/49537* (2013.01); *H01L 23/49555* (2013.01); *H01L 2924/1815* (2013.01)

(56) References Cited

U.S. PATENT DOCUMENTS

| | | | |
|---|---|---|---|
| 5,281,851 A | 1/1994 | Mills et al. | |
| 5,399,804 A | 3/1995 | Yoneda et al. | |
| 5,557,066 A | 9/1996 | Rostoker et al. | |
| 5,592,019 A | 1/1997 | Ueda et al. | |
| 5,753,532 A | 5/1998 | Sim | |
| 5,885,507 A * | 3/1999 | Hendrikus | B29C 45/462 264/328.5 |
| 5,912,024 A * | 6/1999 | Bolanos | B29C 45/463 264/328.5 |
| 6,097,085 A | 8/2000 | Ikemizu et al. | |
| 6,177,718 B1 | 1/2001 | Kozono | |
| 6,498,391 B1 | 12/2002 | Huang et al. | |
| 6,573,119 B1 | 6/2003 | Hirashima et al. | |
| 6,700,210 B1 | 3/2004 | Smith | |
| 7,169,345 B2 * | 1/2007 | Murugan | B29C 45/2708 264/272.17 |
| 7,821,111 B2 | 10/2010 | Tellkamp | |
| 8,022,522 B1 | 9/2011 | Liou et al. | |
| 9,224,677 B1 | 12/2015 | Liou et al. | |
| 9,362,211 B1 | 6/2016 | Gao et al. | |
| 10,037,935 B1 | 7/2018 | Pang et al. | |
| 10,896,826 B2 * | 1/2021 | Hashizume | H01L 21/561 |
| 2001/0028107 A1 | 10/2001 | Wada et al. | |
| 2003/0075796 A1 | 4/2003 | Hata et al. | |
| 2004/0080028 A1 | 4/2004 | Yanagisawa | |
| 2005/0142814 A1 * | 6/2005 | Yamada | H01L 21/561 257/E23.04 |
| 2005/0151268 A1 * | 7/2005 | Boyd | H01L 24/13 257/784 |
| 2006/0261453 A1 | 11/2006 | Lee et al. | |
| 2006/0263988 A1 | 11/2006 | Takahashi et al. | |
| 2007/0090565 A1 * | 4/2007 | Ochi | H01L 21/561 425/572 |
| 2008/0038873 A1 * | 2/2008 | Tanida | H01L 21/566 257/E21.504 |
| 2009/0091007 A1 * | 4/2009 | Tellkamp | H05K 3/3426 438/112 |
| 2010/0006995 A1 | 1/2010 | Kasuya et al. | |
| 2010/0123227 A1 | 5/2010 | Dahilig et al. | |
| 2010/0219517 A1 * | 9/2010 | Yoshiba | H01L 23/49562 257/676 |
| 2010/0259909 A1 | 10/2010 | Ho et al. | |
| 2011/0097854 A1 | 4/2011 | Fujishima et al. | |
| 2011/0198739 A1 | 8/2011 | Amanai | |
| 2011/0317389 A1 | 12/2011 | Higashibata et al. | |
| 2012/0009737 A1 * | 1/2012 | Kuratomi | H01L 24/97 438/123 |
| 2012/0178220 A1 | 7/2012 | Okada et al. | |
| 2012/0238056 A1 | 9/2012 | Numazaki | |
| 2013/0005087 A1 * | 1/2013 | Chen | H01L 21/565 264/272.17 |
| 2013/0105956 A1 | 5/2013 | Jo et al. | |
| 2013/0196473 A1 | 8/2013 | Bai et al. | |
| 2013/0249051 A1 | 9/2013 | Saye | |
| 2013/0285224 A1 | 10/2013 | Takemasa et al. | |
| 2013/0285225 A1 | 10/2013 | Sone et al. | |
| 2014/0091443 A1 | 4/2014 | Duca et al. | |
| 2014/0191378 A1 | 7/2014 | Lee et al. | |
| 2014/0312480 A1 | 10/2014 | Gong et al. | |
| 2014/0374890 A1 | 12/2014 | Yamashita et al. | |
| 2015/0214136 A1 | 7/2015 | Lee et al. | |
| 2015/0243641 A1 | 8/2015 | Eugene et al. | |
| 2015/0351252 A1 | 12/2015 | Biebricher et al. | |
| 2015/0357266 A1 | 12/2015 | Wang et al. | |
| 2015/0380384 A1 * | 12/2015 | Williams | H01L 24/96 438/112 |
| 2016/0148859 A1 | 5/2016 | Muto et al. | |
| 2016/0163615 A1 | 6/2016 | Mitamura et al. | |
| 2016/0233156 A1 | 8/2016 | Song et al. | |
| 2016/0307854 A1 | 10/2016 | Matsubara et al. | |
| 2017/0103904 A1 * | 4/2017 | Nguyen | H01L 21/561 |
| 2017/0162478 A1 | 6/2017 | Kodama | |
| 2017/0213784 A1 * | 7/2017 | Lee | H01L 23/49551 |
| 2017/0213788 A1 | 7/2017 | Shimanuki | |
| 2017/0222131 A1 | 8/2017 | Chew et al. | |
| 2017/0250124 A1 | 8/2017 | Okumura et al. | |
| 2017/0278768 A1 * | 9/2017 | Higgins, III | H01L 21/4825 |
| 2017/0294369 A1 | 10/2017 | Kawashima et al. | |
| 2017/0323845 A1 * | 11/2017 | Lam | H01L 23/49575 |
| 2017/0345743 A1 * | 11/2017 | Lee | H01L 23/49541 |
| 2017/0358523 A1 * | 12/2017 | Lee | H01L 21/4842 |
| 2017/0372988 A1 * | 12/2017 | Groenhuis | H01L 23/3114 |
| 2018/0061745 A1 * | 3/2018 | Otremba | H01L 24/00 |
| 2018/0082930 A1 | 3/2018 | Khoo et al. | |
| 2018/0090423 A1 | 3/2018 | Shimizu et al. | |
| 2018/0182692 A1 | 6/2018 | Danno et al. | |
| 2018/0247884 A1 | 8/2018 | Hasegawa et al. | |
| 2018/0331019 A1 | 11/2018 | Okumura | |
| 2018/0331067 A1 | 11/2018 | Williams et al. | |
| 2018/0374800 A1 | 12/2018 | Baloglu et al. | |
| 2019/0074243 A1 | 3/2019 | Sander et al. | |
| 2019/0122900 A1 * | 4/2019 | Hashizume | H01L 23/49541 |
| 2019/0148173 A1 | 5/2019 | Taguchi | |
| 2019/0157110 A1 * | 5/2019 | Nguyen | H01L 21/565 |
| 2019/0318999 A1 | 10/2019 | Kawashima | |
| 2019/0326195 A1 | 10/2019 | Han | |
| 2019/0348335 A1 | 11/2019 | Mineta | |
| 2019/0355652 A1 | 11/2019 | Chou et al. | |
| 2019/0371712 A1 | 12/2019 | Urushihata et al. | |
| 2019/0371713 A1 | 12/2019 | Taguchi | |
| 2020/0027839 A1 | 1/2020 | Hino et al. | |
| 2020/0203262 A1 | 6/2020 | Ching, Jr. et al. | |
| 2020/0203289 A1 | 6/2020 | Ching, Jr. et al. | |
| 2020/0211939 A1 | 7/2020 | Khanolkar et al. | |
| 2020/0235042 A1 | 7/2020 | Bin Abdul Aziz et al. | |
| 2020/0235057 A1 | 7/2020 | Hud et al. | |

FOREIGN PATENT DOCUMENTS

| | | | | |
|---|---|---|---|---|
| CN | 108695167 A | * | 10/2018 | ....... B29C 45/14467 |
| DE | 102017101596 | | 8/2017 | |
| KR | 20020030341 A | * | 4/2002 | ............ H01L 23/02 |
| KR | 20020077707 A | * | 10/2002 | ............ H01L 21/565 |
| KR | 1020060022317 A | * | 3/2006 | ............ H01L 21/565 |
| WO | 02093645 | | 11/2002 | |
| WO | WO-2006129926 A1 | * | 12/2006 | ............ H01L 21/565 |
| WO | 2011155165 | | 12/2011 | |
| WO | 2012011210 | | 1/2012 | |

OTHER PUBLICATIONS

Machine translation, Huang, Chinese Pat. Pub. No. CN-203792581-U, translation date: Sep. 22, 2022, Espacenet, all pages. (Year : 2022).*

Machine translation, Hyun, Korean Pat. Pub. No. KR-20020077707-A, translation date: Sep. 22, 2022, Clarivate Analytics, all pages. (Year: 2022).*

Machine translation, Matsuo, Chinese Pat. Pub. No. CN-108695167-A, translation date: Sep. 22, 2022, Clarivate Analytics, all pages. (Year: 2022).*

Machine translation, Ning, Chinese Pat. Pub. No. CN-207432667-U, translation date: Sep. 22, 2022, Clarivate Analytics, all pages. (Year: 2022).*

(56) References Cited

OTHER PUBLICATIONS

Machine translation, Park, Korean Pat. Pub. No. KR20060022317-A, translation date: Sep. 22, 2022, Espacenet, all pages. (Year: 2022).*

Machine translation, Park, Korean Pat. Pub. No. KR20060022317A, translation date: Mar. 21, 2023, Clarivate Analytics, all pages. (Year: 2023).*

* cited by examiner

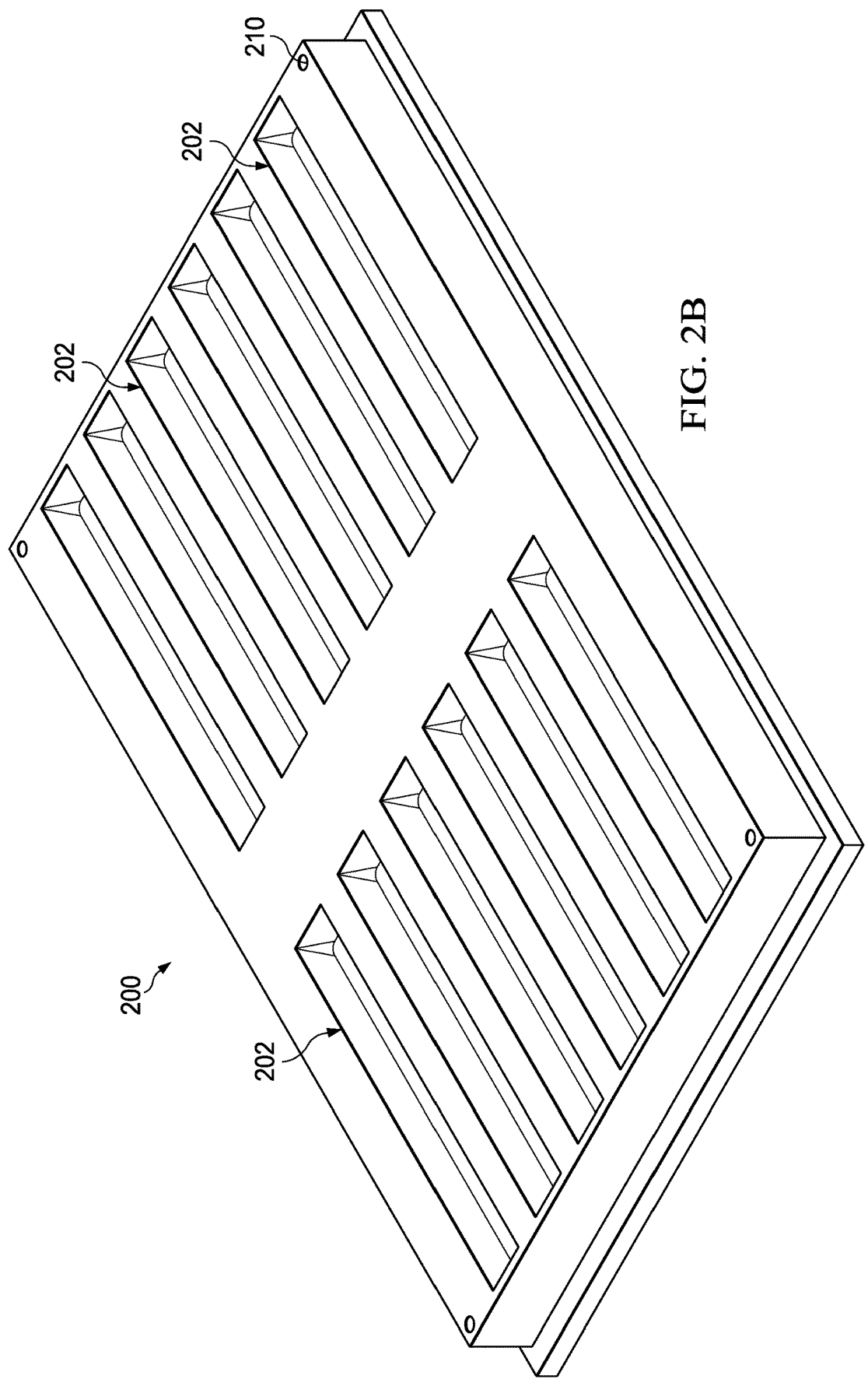

UNIVERSAL SEMICONDUCTOR PACKAGE MOLDS

This application is a continuation of U.S. patent application Ser. No. 16/533,305, filed Aug. 6, 2019, the contents of all of which are herein incorporated by reference in its entirety.

SUMMARY

In accordance with at least one example of the disclosure, a system comprises a semiconductor package, comprising a first side surface having a first set of metal contacts extending therefrom; a second side surface having a second set of metal contacts extending therefrom; a top surface; a bottom surface; and an end surface meeting at least one of the first side surface, the second side surface, the top surface, and the bottom surface at a non-rounded edge.

In accordance with at least one example of the disclosure, a method comprises providing a lead frame having a plurality of semiconductor dies positioned in a column; positioning the lead frame over a semiconductor packaging mold such that the plurality of semiconductor dies are positioned over a semiconductor die cavity; placing a second semiconductor packaging mold over the lead frame; injecting a mold compound into the semiconductor die cavity; removing the second semiconductor packaging mold; removing the lead frame from the semiconductor packaging mold; and singulating the plurality of semiconductor dies to produce a plurality of semiconductor packages, each of the plurality of semiconductor packages comprising a semiconductor die encapsulated within the mold compound.

BRIEF DESCRIPTION OF THE DRAWINGS

For a detailed description of various examples, reference will now be made to the accompanying drawings in which:

FIG. 2B is a perspective view of a top semiconductor packaging mold, in accordance with various examples.

DETAILED DESCRIPTION

Figure 1A:
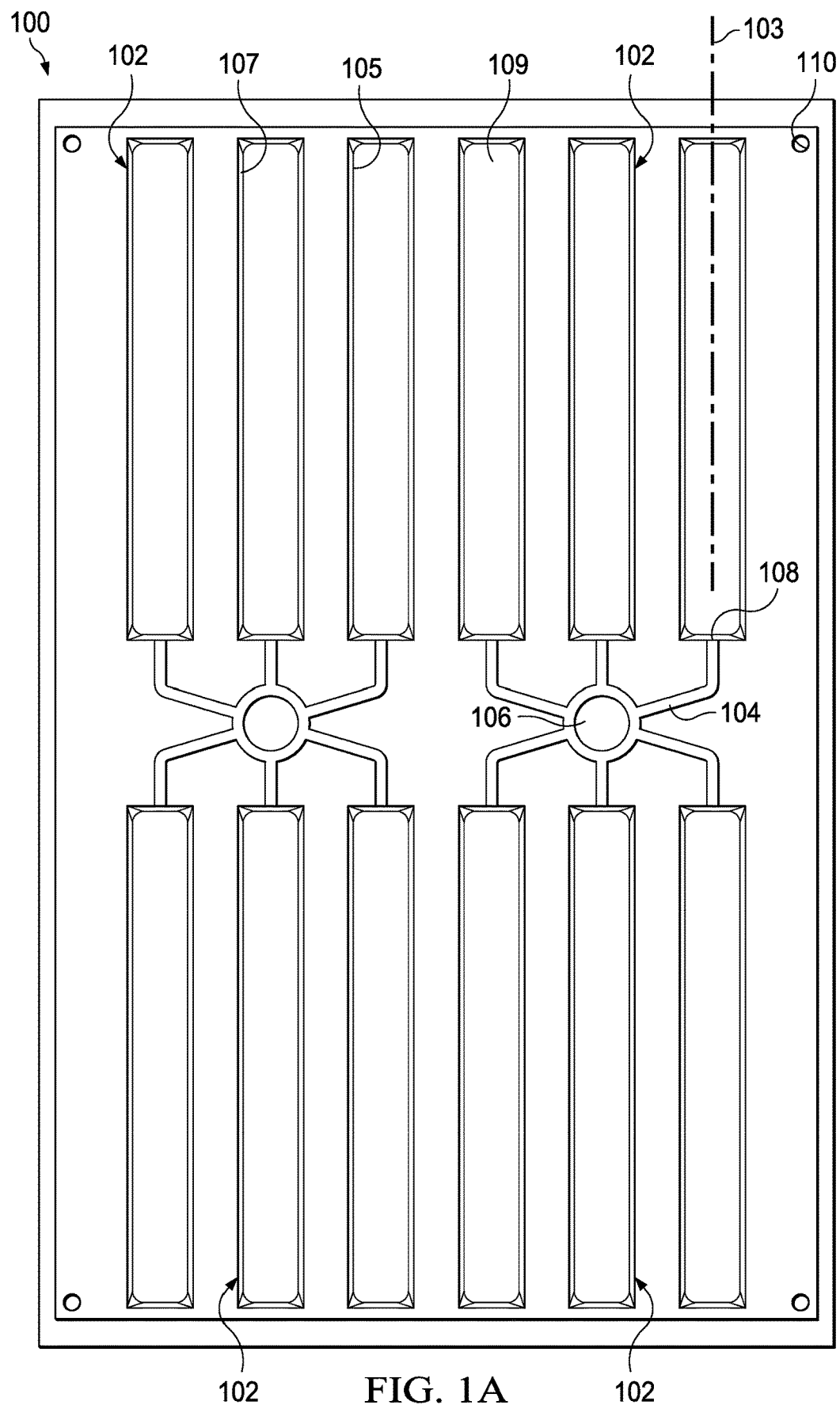
FIG. 1A is a top-down view of a bottom semiconductor packaging mold, in accordance with various examples.

Semiconductor dies are typically housed inside packages that protect the dies from deleterious environmental influences, such as heat, moisture, and debris. A packaged die communicates with electronic devices outside the package via metal contacts that extend from within the package to an exterior of the package.

The packaging process is unnecessarily inefficient and expensive. Multiple semiconductor dies are mounted on the die pads of a lead frame. The lead frame is then positioned between a pair of semiconductor packaging molds. Cavities formed within the molds align with each other to form multiple combined cavities, with each of the semiconductor dies positioned inside a different such combined cavity. The cavities are then injected with a mold compound to encapsulate the semiconductor dies. The molds are opened, and the newly-formed semiconductor packages are removed from the molds and further processed. This packaging process is inefficient and expensive at least because each pair of molds is designed to accommodate only a specific type of die with a specific number of metal contacts (or "leads"). For example, the same mold pair cannot be used to package both a semiconductor die with 8 metal contacts and a semiconductor die with 12 metal contacts. This inability results in the need to purchase expensive additional sets of molds and to make adjustments during the packaging process to accommodate differing die types.

This disclosure describes various examples of a semiconductor packaging process and semiconductor packaging equipment that are usable to package dies of different types (e.g., dies with different numbers of metal contacts). In one example, a lead frame has multiple semiconductor dies arranged in a column. This lead frame is positioned between a pair of semiconductor packaging molds, which together form a cavity in which all of the semiconductor dies of the column may be placed. The molds may contain numerous such cavities such that a different column of dies may be positioned within each of these cavities. The cavities are not physically configured to accommodate any particular number of dies or any particular number of metal contacts per die, as is the case with traditional molds. Rather, the cavities can accommodate varying numbers of dies and varying numbers of metal contacts per die. The molds are closed and the cavities are injected with a mold compound. The molds are then opened and the lead frame is removed, thus producing a lead frame with a single, continuous block of mold compound encapsulating each column of dies. The lead frame is then trimmed, the metal contacts of the dies are formed (e.g., in a gullwing shape), and each single, continuous block of mold compound is singulated to produce a plurality of semiconductor packages. This same pair of molds and this same process can subsequently be used to package a different number of dies that have different numbers of metal contacts. Because a single, "universal" pair of molds can be used to package various numbers and types of dies, the inflexibility, expense, and inefficiency associated with buying and using multiple pairs of molds is mitigated.

FIG. 1A is a top-down view of a bottom semiconductor packaging mold 100, in accordance with various examples. The bottom semiconductor packaging mold 100 is the bottom part of a pair of semiconductor packaging molds that are used in tandem, the top part of which is described below. The bottom semiconductor packaging mold 100 includes a plurality of semiconductor die cavities 102. In some examples, the semiconductor die cavities 102 are greater in length than many traditional die cavities, although the scope of this disclosure is not limited to any particular cavity length. In some examples, each of the semiconductor die cavities 102 is sufficiently long to accommodate multiple semiconductor dies that are positioned in an end-to-end, or "chain," configuration along a longitudinal axis 103, as described in greater detail below. In some examples, the semiconductor die cavities 102 are shaped to produce the packages depicted and described below, and more specifically to produce the bottom portions of the packages depicted and described below. For example, a semiconductor die cavity 102 may comprise rounded edges 105. In addition, an illustrative semiconductor die cavity 102 may include side cavity surfaces 107 that form obtuse angles with the bottom cavity surface 109 (e.g., to facilitate the removal of semiconductor packages from the semiconductor die cavity 102 after molding is complete). In examples, the semiconductor die cavities 102 may comprise a portion (e.g., half) of a hexagonal or octagonal prism.

Figure 1B:
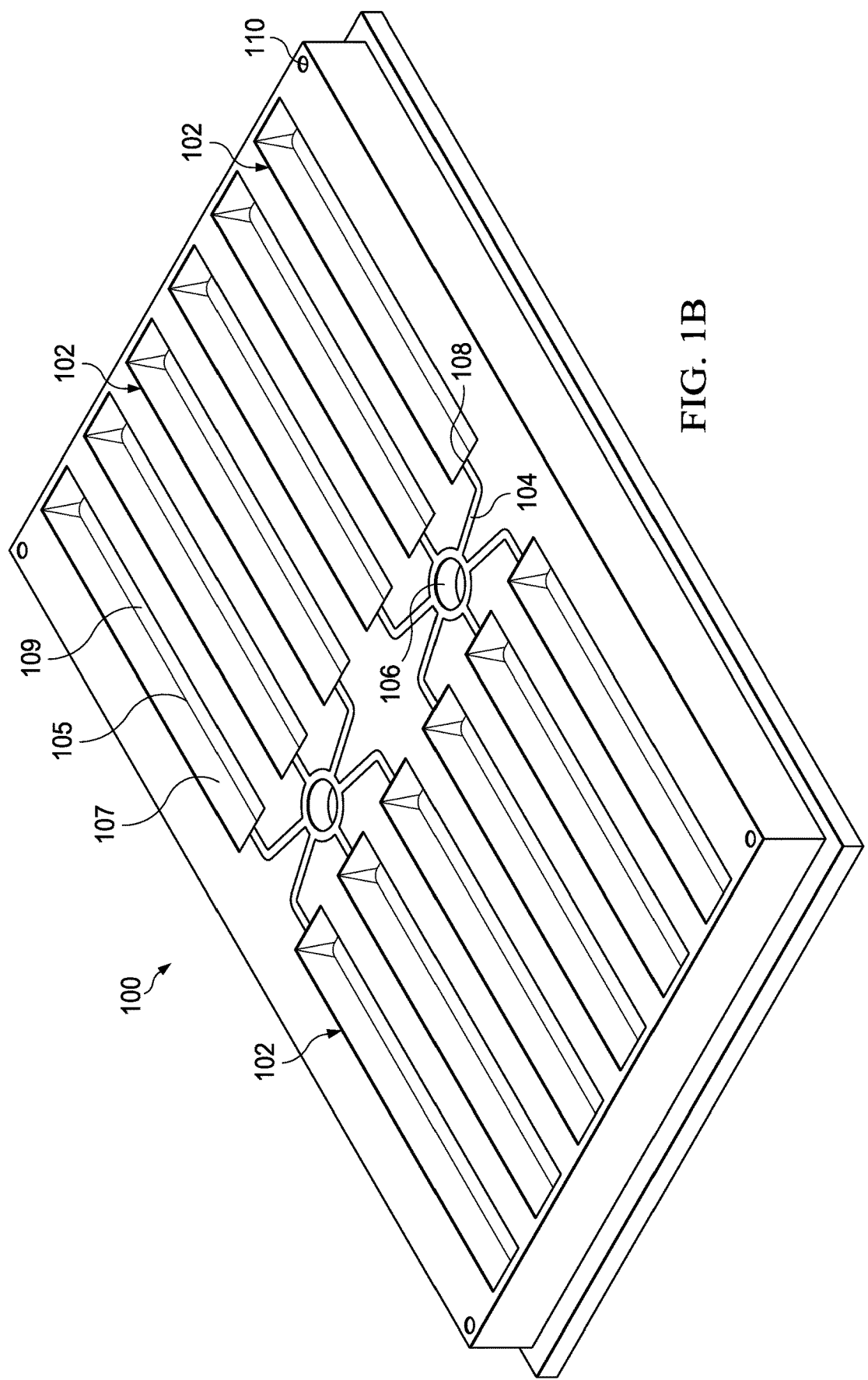
FIG. 1B is a perspective view of a bottom semiconductor packaging mold, in accordance with various examples.

The bottom semiconductor packaging mold 100 also includes a mold compound storage cavity 106 that supplies a fluid mold compound to each of the semiconductor die cavities 102 via runner cavities 104. Each runner cavity 104 couples to a corresponding semiconductor die cavity 102 via a gate 108. The bottom semiconductor packaging mold 100 may include orifices 110 to which a fastening member may couple when a top semiconductor packaging mold is positioned over the bottom semiconductor packaging mold 100. FIG. 1B is a perspective view of the bottom semiconductor packaging mold 100, in accordance with various examples.

Figure 2A:
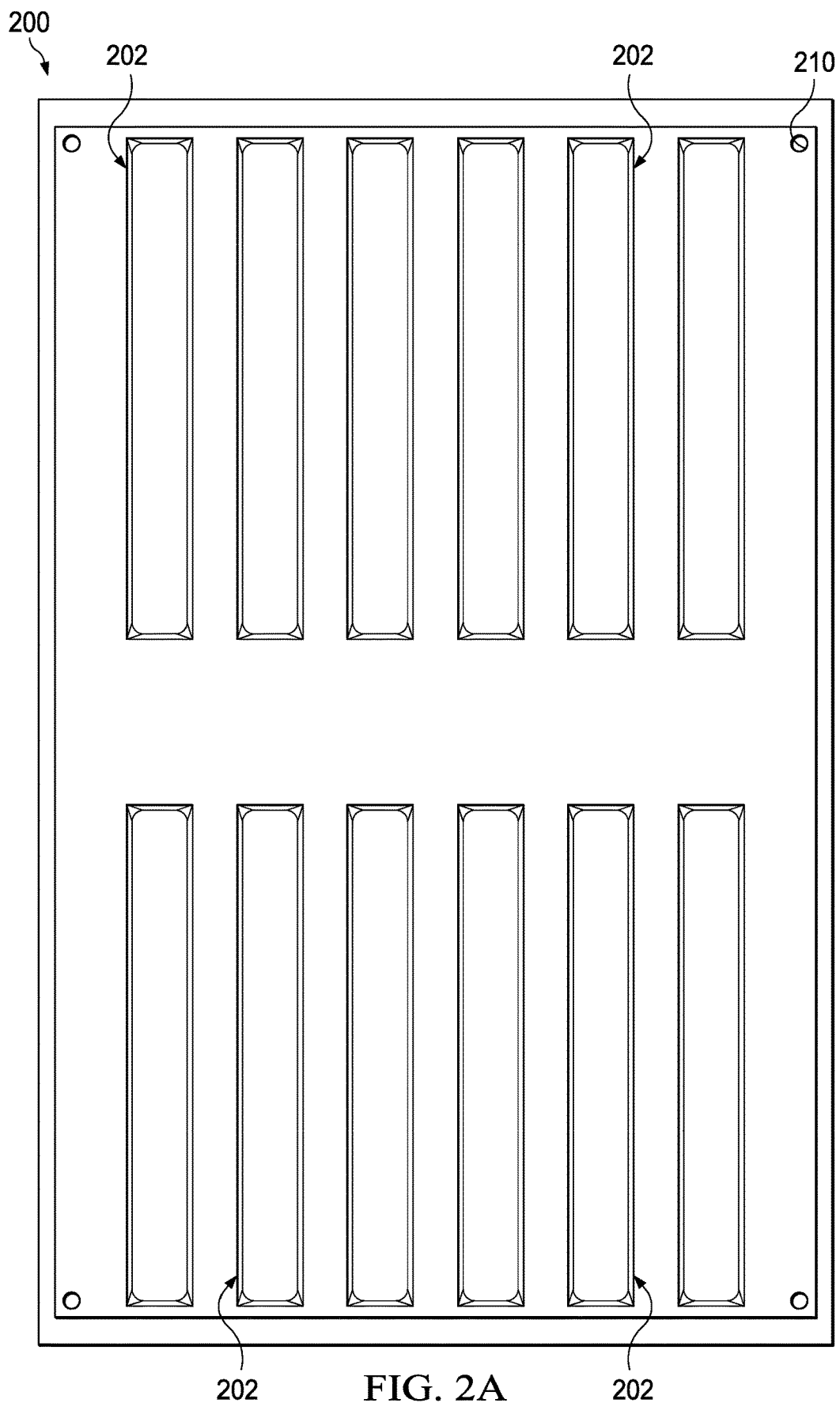
FIG. 2A is a top-down view of a top semiconductor packaging mold, in accordance with various examples.

FIG. 2A is a top-down view of a top semiconductor packaging mold 200, in accordance with various examples. The top semiconductor packaging mold 200 comprises a plurality of semiconductor die cavities 202. The top semiconductor packaging mold 200 also comprises orifices 210, which, in some examples, may instead be fastening members 210. The orifices or fastening members 210 may be used alone or in combination with other suitable fastening elements to couple with the orifices 110 (FIGS. 1A and 1B) so that the semiconductor die cavities 202 align with the semiconductor die cavities 102 (FIGS. 1A and 1B). When aligned in this manner, each pair of semiconductor die cavities 102, 202 forms a combined cavity that may be used to simultaneously apply a mold compound to multiple semiconductor dies that are positioned within the combined cavity. The semiconductor die cavities 202 may have a shape (e.g., edges, surfaces, and angles between surfaces) that is similar to that of the semiconductor die cavities 102 (FIGS. 1A and 1B). For example, the semiconductor die cavities 202 may form a portion (e.g., half) of a hexagonal or octagonal prism. The semiconductor dies are positioned within the combined cavity by positioning a lead frame with multiple columns of multiple semiconductor dies between the top and bottom semiconductor packaging molds 100, 200 prior to closing the molds, as described below. FIG. 2B is a perspective view of the top semiconductor packaging mold 200, in accordance with various examples.

Figure 3A:
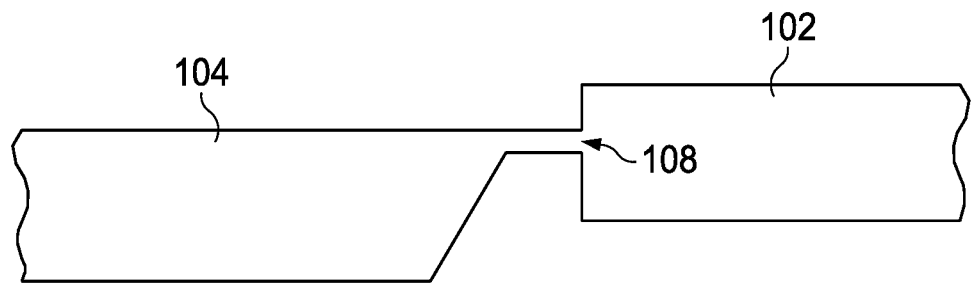
FIG. 3A is a cross-sectional view of an interface between a runner cavity and a semiconductor die cavity, in accordance with various examples.
Figure 3B:
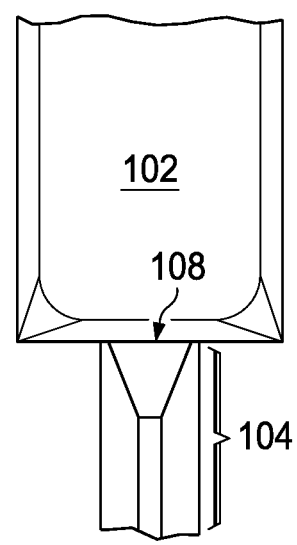
FIG. 3B is a top-down view of an interface between a runner cavity and a semiconductor die cavity, in accordance with various examples.

FIG. 3A is a cross-sectional view of an interface between a runner cavity 104 and a semiconductor die cavity 102, in accordance with various examples. In this example, the bottom surface of the runner cavity 104 slopes upward as it approaches the semiconductor die cavity 102, ultimately connecting with the semiconductor die cavity 102 via a gate 108. In some examples, the gate 108 comprises a narrow orifice through which the fluid mold compound is injected into the semiconductor die cavity 102. FIG. 3B is a top-down view of the interface between the runner cavity 104 and the semiconductor die cavity 102, including the gate 108, in accordance with various examples.

Figure 4:
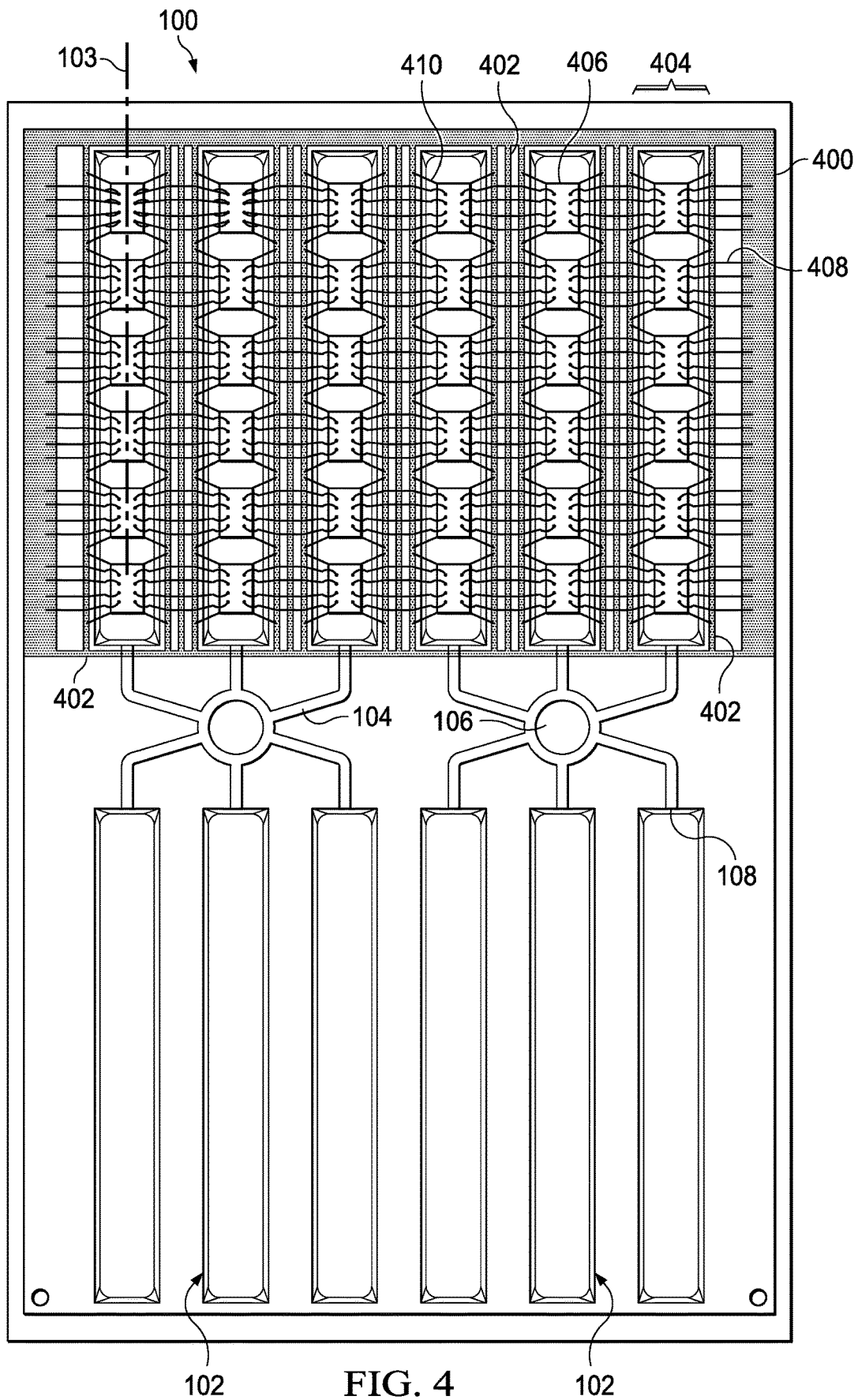
FIG. 4 is a top-down view of a lead frame having dies with 8 metal contacts and positioned above and abutting a bottom semiconductor packaging mold, in accordance with various examples.

FIG. 4 is a top-down view of a lead frame 400 having dies with 8 metal contacts and positioned above and abutting a bottom semiconductor packaging mold, in accordance with various examples. Specifically, the lead frame 400 includes a plurality of semiconductor dies 406. (Although the lead frame 400 itself is not composed of dies, dies may be mounted on the lead frame 400 and thus said to be part of the lead frame 400. For example, the lead frame 400 may include multiple die pads on which dies are mounted.) As depicted, the semiconductor dies 406 are arranged in columns 404. FIG. 4 depicts the columns 404 including six semiconductor dies 406, but any number of semiconductor dies may be included in a column. The semiconductor dies 406 may sit on a die pad (not pictured for clarity purposes) that couples to one or more dam bars 402 via one or more tie bars 410. Dam bars 402 may couple to other dam bars 402 via metal contacts (e.g., leads) 408. The semiconductor dies 406 may couple to the metal contacts 408 via bond wires, although other techniques for such coupling are contemplated and included within the scope of this disclosure.

As shown, the lead frame 400 is positioned over and abutting the bottom semiconductor packaging mold 100 such that each column 404 of semiconductor dies 406 is positioned above a different semiconductor die cavity 102. Stated another way, each column 404 is positioned above its own semiconductor die cavity 102 such that all semiconductor dies 406 of that column 404 are positioned above that cavity 102 and such that the semiconductor dies 406 are aligned with the longitudinal axis 103 of that cavity 102. The semiconductor dies 406 in the column 404 may be of any suitable number and any suitable type (e.g., size, number of metal contacts 408).

Figure 5:
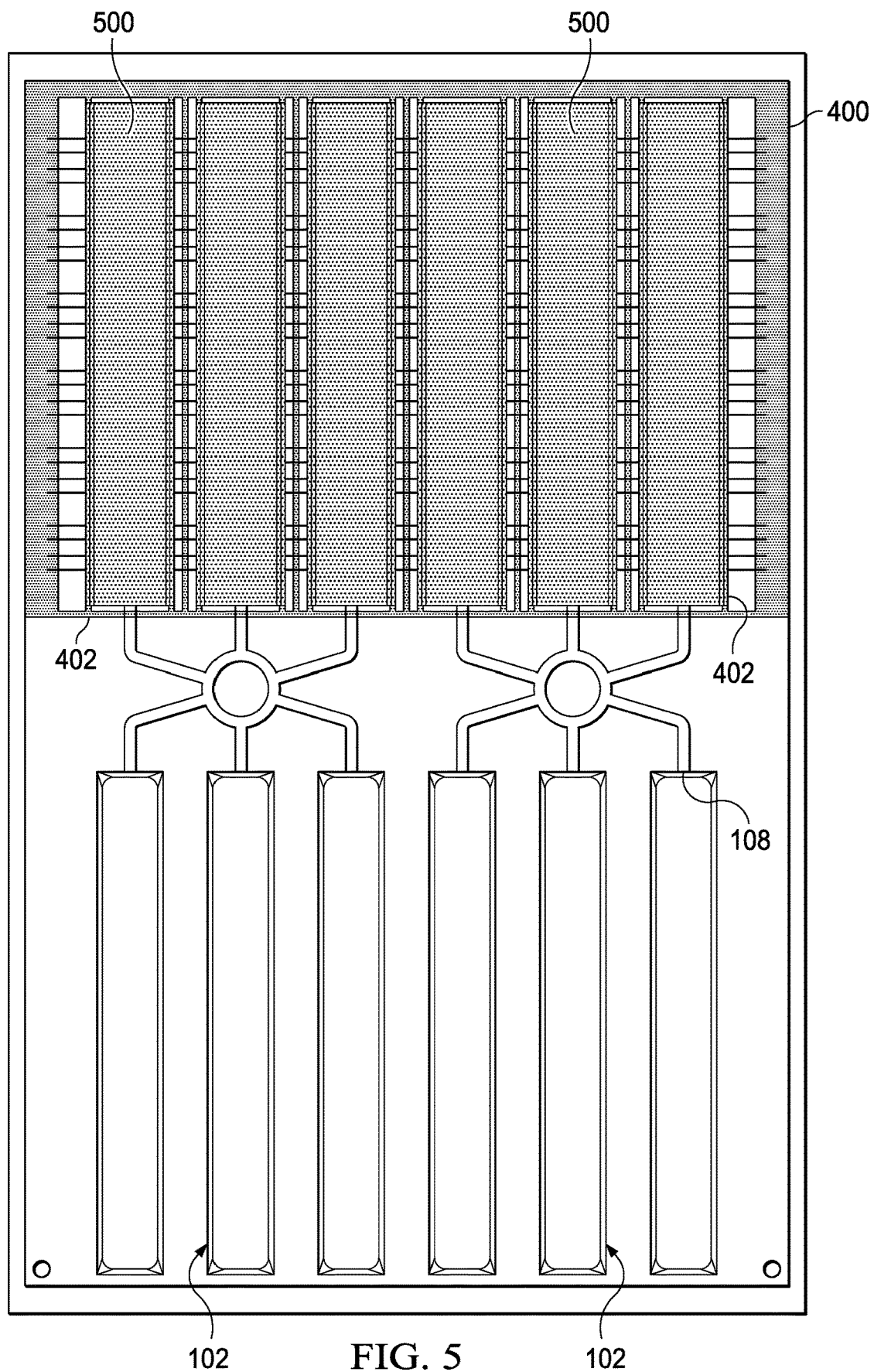
FIG. 5 is a top-down view of a molded lead frame having dies with 8 metal contacts and positioned above and abutting a bottom semiconductor packaging mold, in accordance with various examples.

Once the lead frame 400 is positioned over and abutting the bottom semiconductor packaging mold 100 as depicted in FIG. 4, the top semiconductor packaging mold 200 (FIGS. 2A and 2B) is closed over the bottom semiconductor packaging mold 100, thereby forming a plurality of combined cavities due to the alignment of the semiconductor die cavities 102 and 202. In some examples, the semiconductor dies 406 are positioned roughly in the center of these combined cavities, although the scope of this disclosure is not limited as such. Referring briefly to FIG. 1A, a mold compound (e.g., epoxy) from the mold compound storage cavities 106 is injected into the combined cavities (i.e., into the semiconductor die cavities 102 and/or 202) via the runner cavities 104 and the gates 108. Once the mold compound sets and is solidified, the top semiconductor packaging mold 200 may be removed, as FIG. 5 depicts. FIG. 5 shows a molded lead frame 400 having solidified mold columns 500 encapsulating the columns 404 of semiconductor dies 406. Because the semiconductor die cavities 102, 202 store an entire column 404 of semiconductor dies 406 during the molding process, the mold columns 500 are continuous, e.g., the mold encapsulating one semiconductor die 406 of a column 404 is continuous with the mold encapsulating another semiconductor die 406 of that same column 404.

Figure 6:
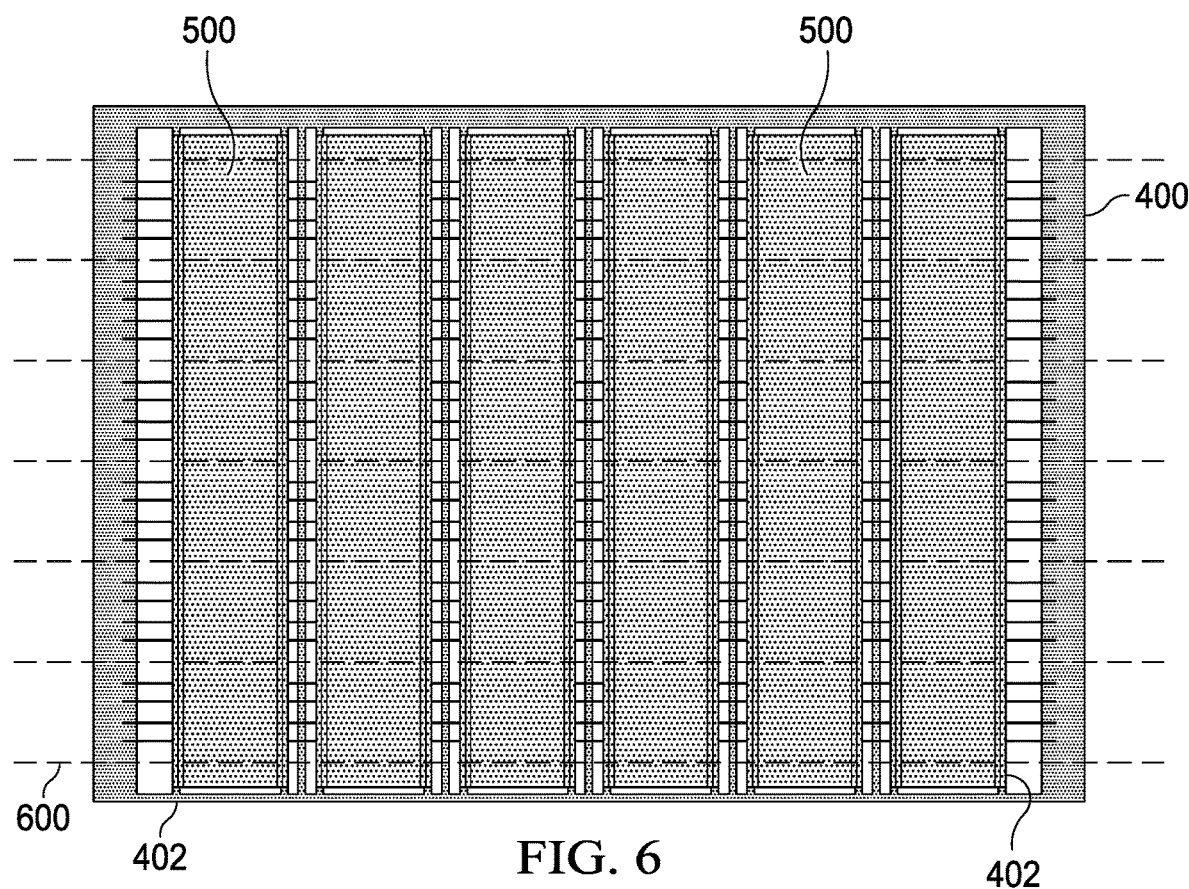
FIG. 6 is a top-down view of a molded lead frame having dies with 8 metal contacts after removal from a bottom semiconductor packaging mold, in accordance with various examples.

FIG. 6 is a top-down view of the molded lead frame 400 after removal from the bottom semiconductor packaging mold 102. FIG. 6 also depicts a plurality of singulation lines 600. As described below, the mold columns 500 are singulated (e.g., sawn) along the singulation lines 600 to separate the molded semiconductor dies 406 from each other to produce individual semiconductor packages. Singulation of the continuous mold columns 500 produces semiconductor packages with distinctive physical features, as is also described below in detail.

Figure 7:
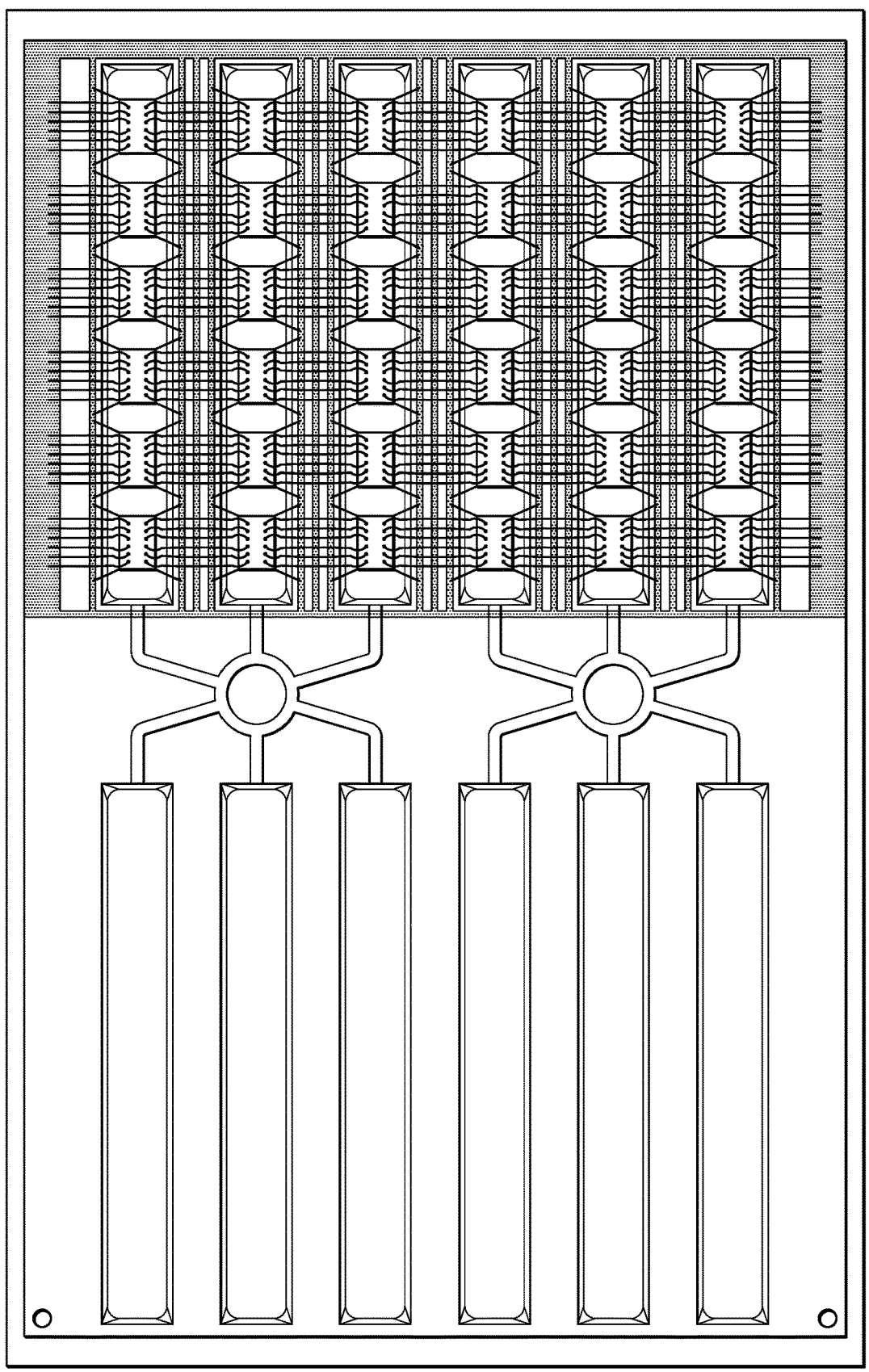
FIG. 7 is a top-down view of a lead frame having dies with 12 metal contacts and positioned above and abutting a bottom semiconductor packaging mold, in accordance with various examples.
Figure 8:
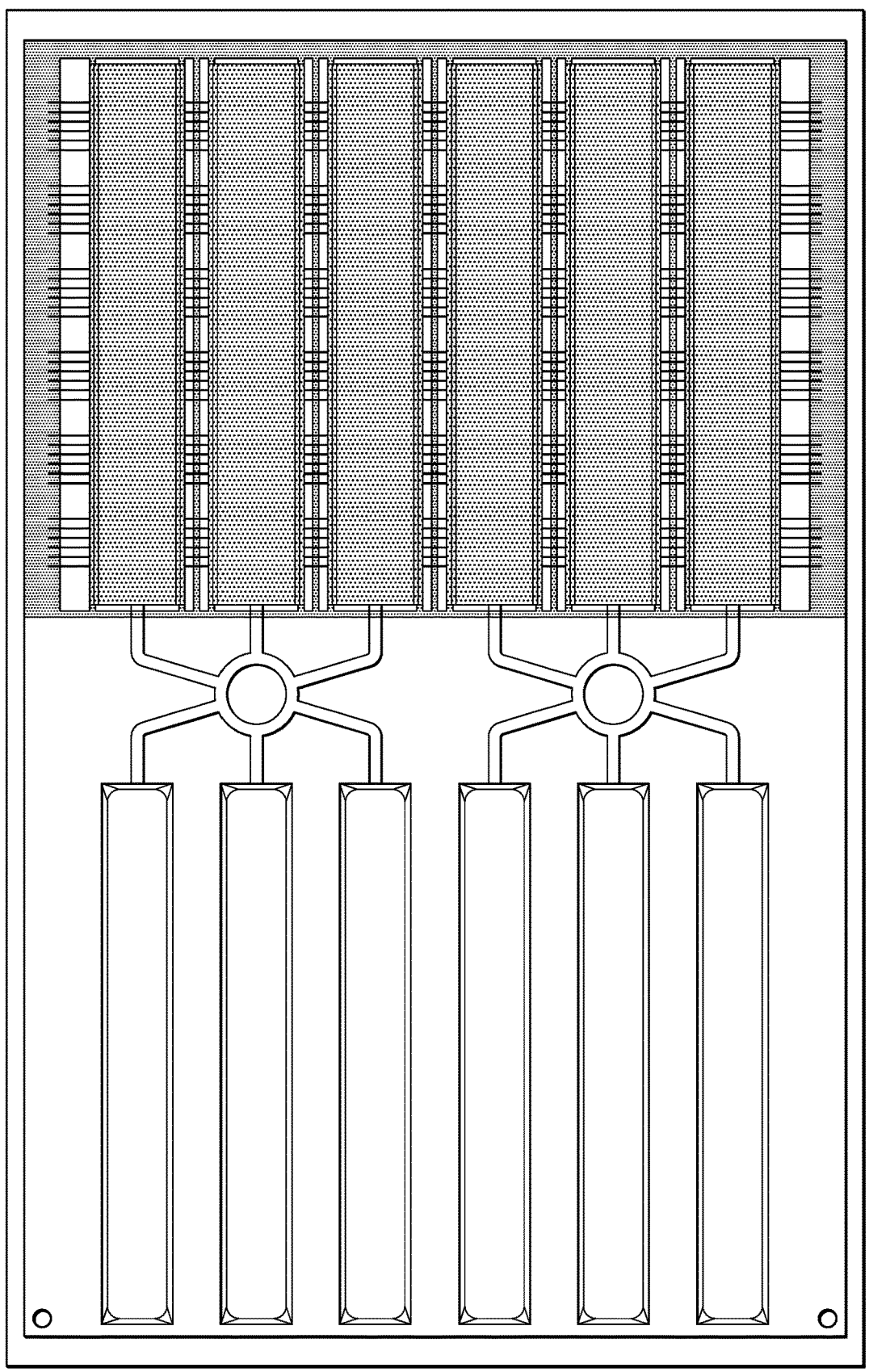
FIG. 8 is a top-down view of a molded lead frame having dies with 12 metal contacts and positioned above and abutting a bottom semiconductor packaging mold, in accordance with various examples.
Figure 9:
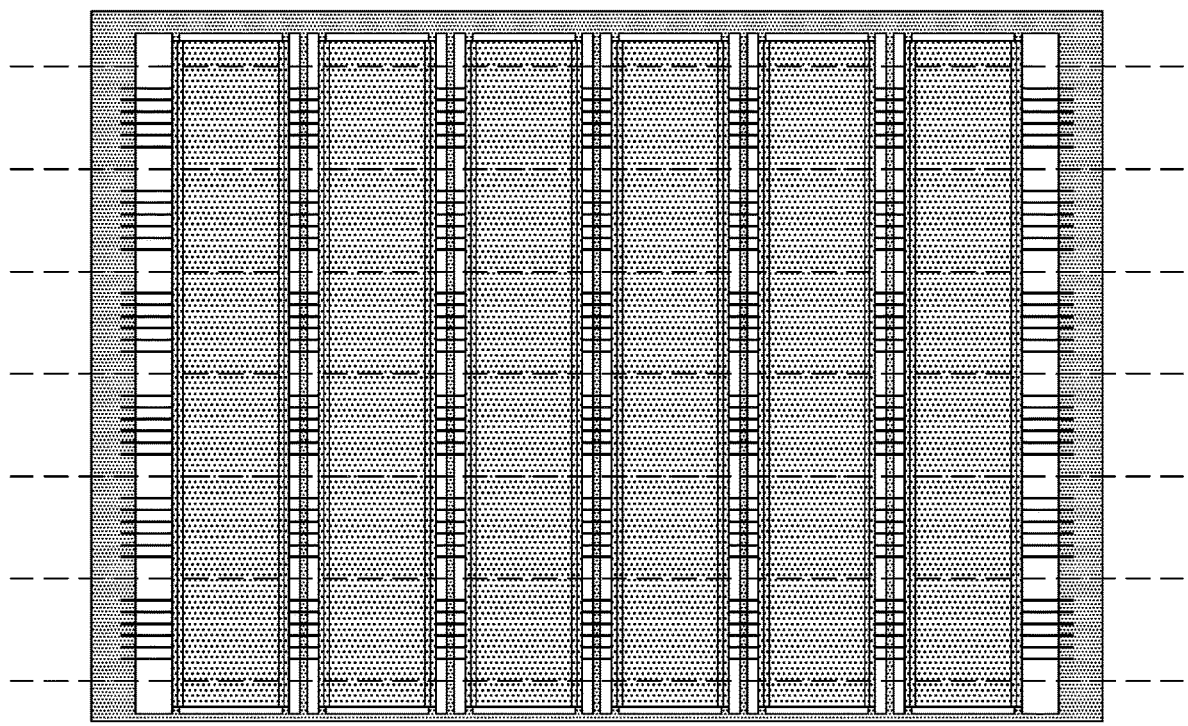
FIG. 9 is a top-down view of a molded lead frame having dies with 12 metal contacts after removal from a bottom semiconductor packaging mold, in accordance with various examples.

As explained above, the semiconductor packaging molds described herein may be used to package semiconductor dies having any number of metal contacts. Accordingly, to illustrate this principle, FIGS. 7-9 depict the molding of semiconductor dies having 12 metal contacts per die. FIG. 7 generally corresponds to FIG. 4 except with the use of 12 metal contacts instead of 8 metal contacts. FIG. 8 generally corresponds to FIG. 5 except with the use of 12 metal contacts instead of 8 metal contacts. FIG. 9 generally corresponds to FIG. 6 except with the use of 12 metal contacts instead of 8 metal contacts. The use of 8 metal contacts and 12 metal contacts is merely illustrative and does not limit the scope of this disclosure.

After the molded lead frame 400 is removed from the bottom semiconductor packaging mold 100, the lead frame 400 is trimmed (e.g., the removal of dam bars 402), the metal contacts 408 are formed (e.g., shaped as gullwing leads), and the semiconductor dies 406 are singulated (e.g., using a jig and saw) to produce individual semiconductor packages. FIGS. 10A-11E depict illustrative, completed semiconductor packages and are now described in turn.

Figure 10A:
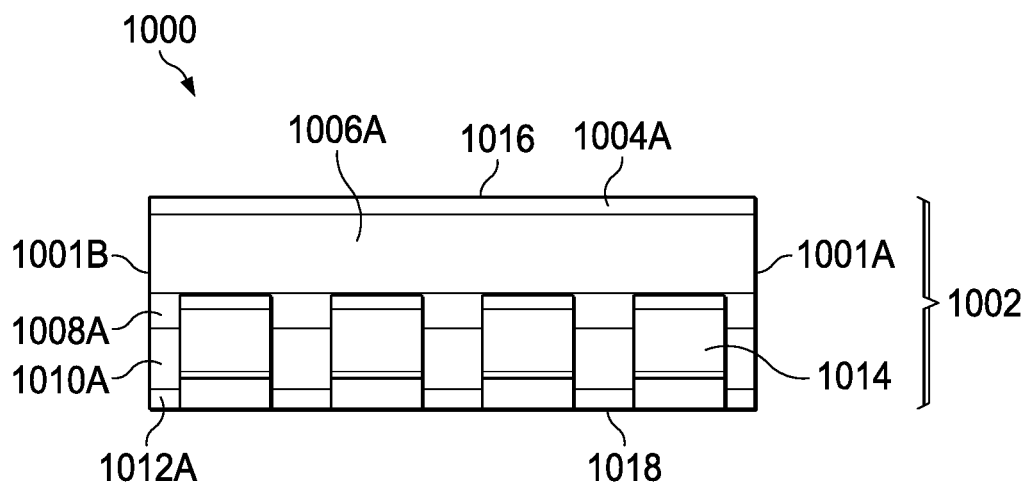
FIG. 10A is a side view of a semiconductor package having 8 metal contacts and formed by the processes described herein, in accordance with various examples.

FIG. 10A is a side view of a semiconductor package 1000 having 8 metal contacts and formed by the processes described herein, in accordance with various examples. Specifically, the semiconductor package 1000 comprises a package body 1002 that includes the semiconductor die, bond wires, and portions of the metal contacts housed within the mold compound. The package body 1002 has multiple surfaces. The view of FIG. 10A depicts a top surface 1016 and side surfaces 1006A, 1008A, and 1010A. The package body 1002 also includes rounded edges 1004A and 1012A, which, in some cases, can also be considered to be "surfaces" (e.g., rounded surfaces, whereas in at least some examples the remaining surfaces described herein may be flat surfaces). In some examples, the edges 1004A and 1012A are not rounded but are sharp. The package body 1002 further comprises an end surface 1001A and another end surface 1001B opposite the end surface 1001A. A bottom surface 1018 opposes the top surface 1016. FIG. 10A depicts four metal contacts 1014 extending from the side surface 1008A, although the metal contacts 1014 may extend from any surface or combination of surfaces of the package body 1002.

Figure 10B:
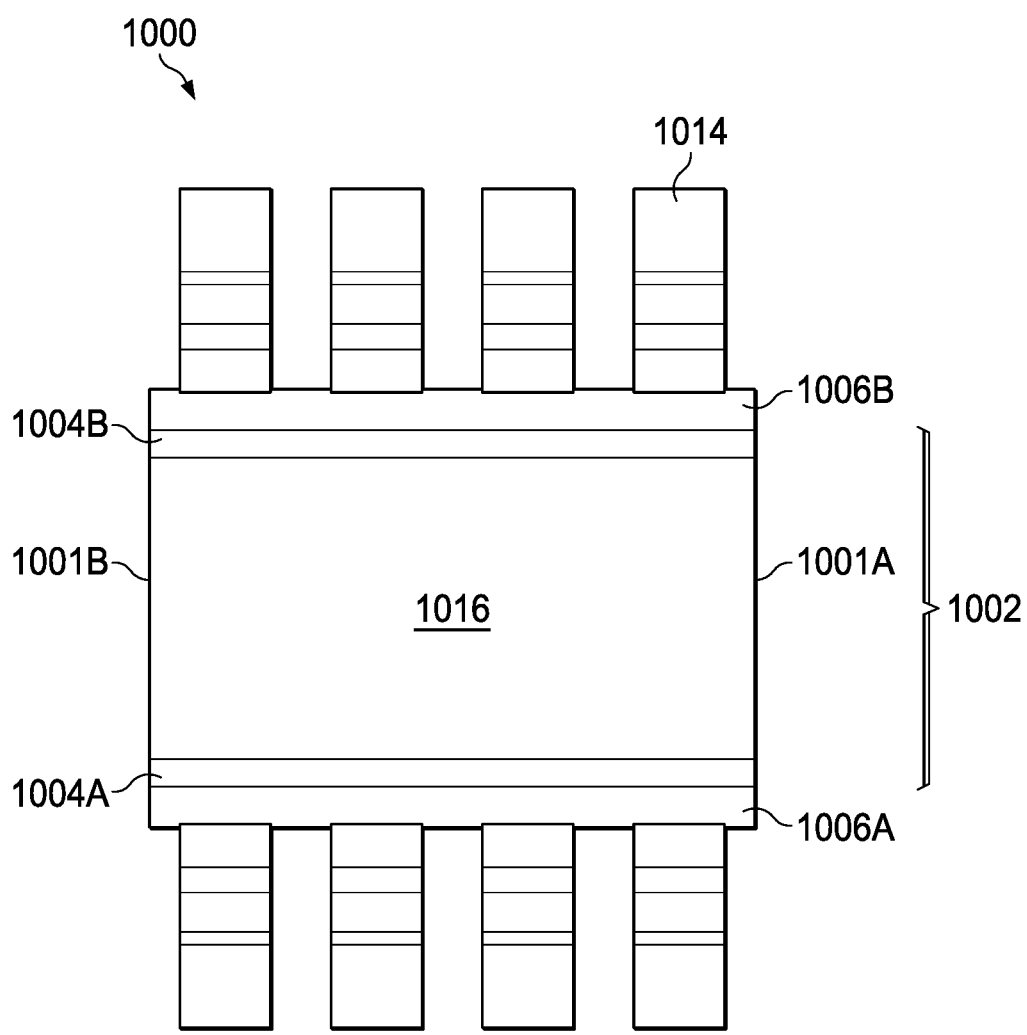
FIG. 10B is a top-down view of a semiconductor package having 8 metal contacts and formed by the processes described herein, in accordance with various examples.

FIG. 10B is a top-down view of the semiconductor package 1000. The view of FIG. 10B depicts a portion of the far side of the package body 1002 not visible in FIG. 10A—namely, the edge 1004B, which in some examples is a rounded edge and in other examples is a sharp edge. The view of FIG. 10B also depicts all 8 of the metal contacts 1014.

Figure 10C:
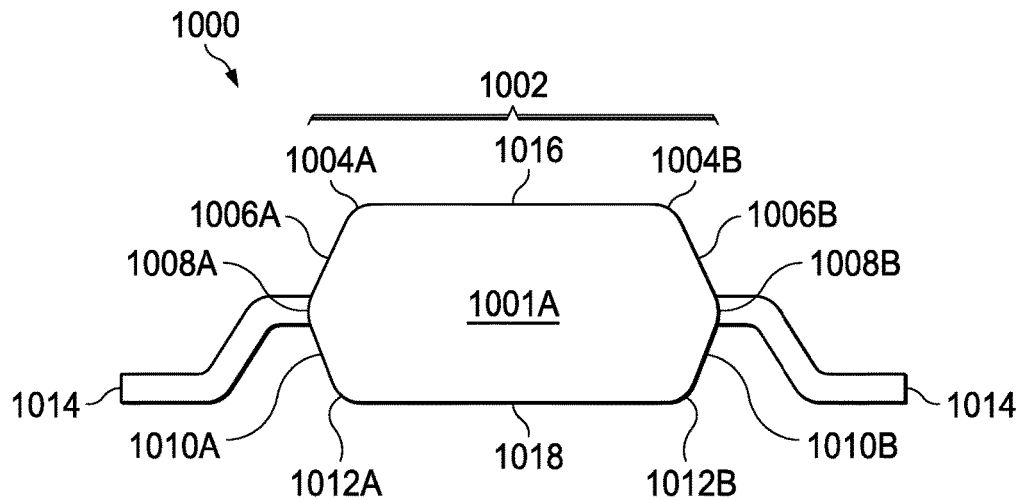
FIG. 10C is a front view of a semiconductor package having 8 metal contacts and formed by the processes described herein, in accordance with various examples.

FIG. 10C is a front view of the semiconductor package 1000. The view of FIG. 10C depicts all surfaces except for the end surface 1001B, including top surface 1016; bottom surface 1018; side surfaces 1006A, 1006B, 1008A, 1008B, 1010A, and 1010B; and end surface 1001A. FIG. 10C also depicts edges 1004A, 1004B, 1012A, and 1012B, which, as explained, may be rounded or sharp edges.

Figure 10D:
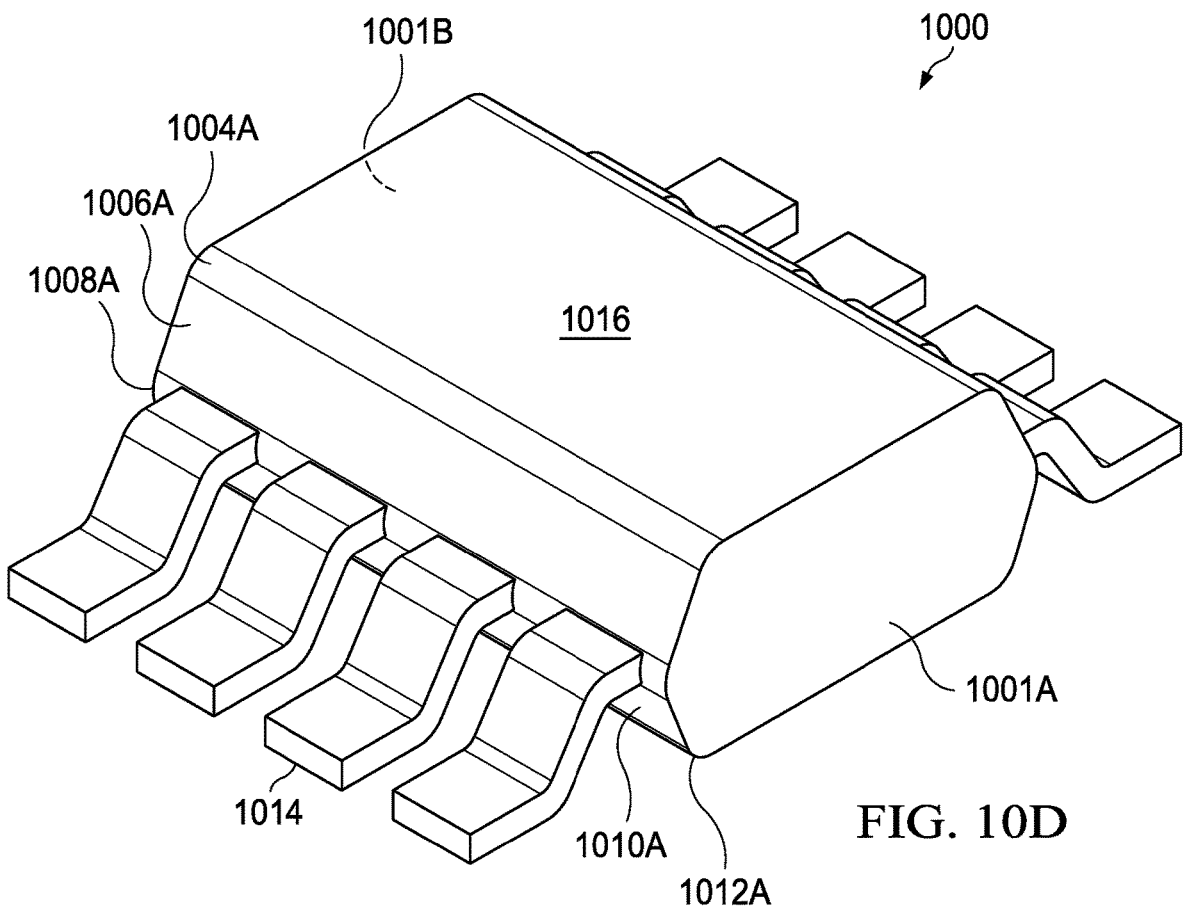
FIG. 10D is a perspective view of a semiconductor package having 8 metal contacts and formed by the processes described herein, in accordance with various examples.
Figure 10E:
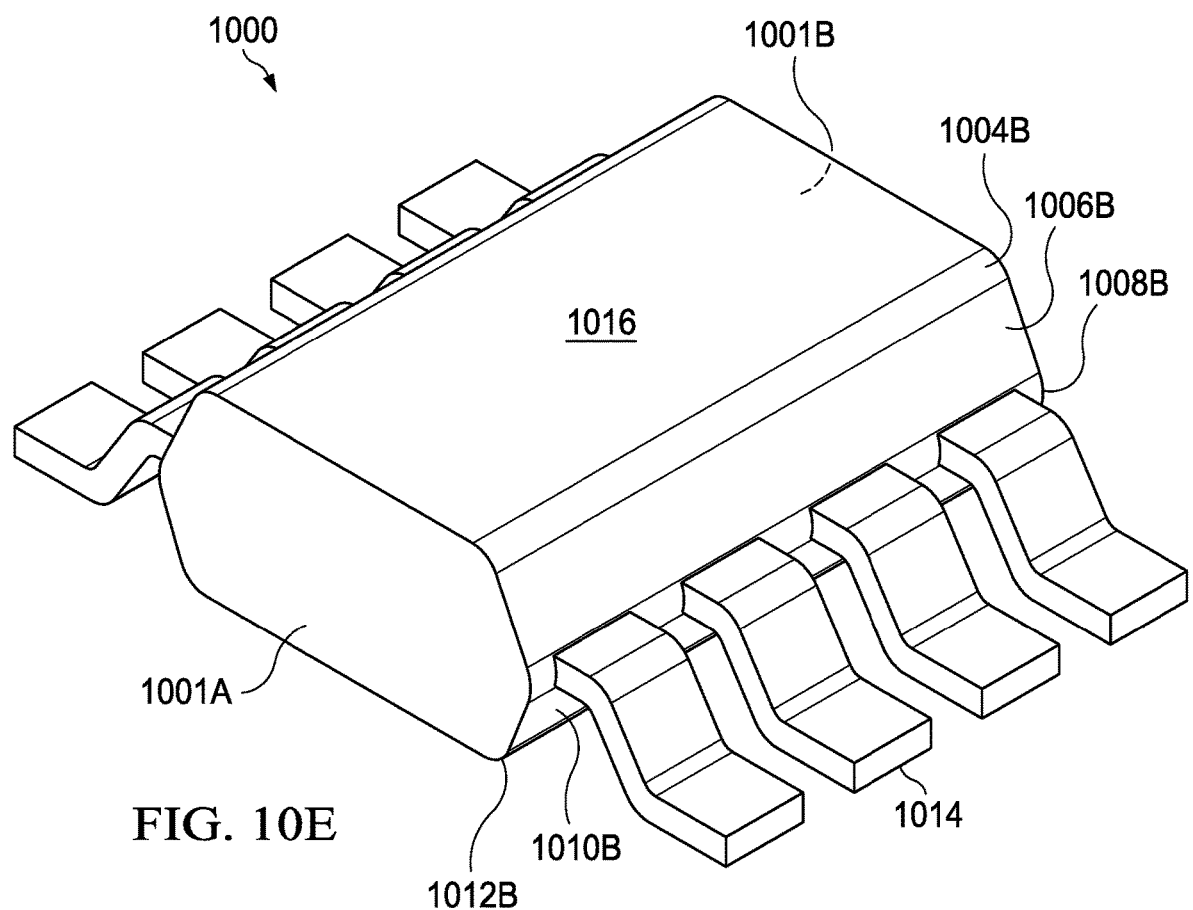
FIG. 10E is another perspective view of a semiconductor package having 8 metal contacts and formed by the processes described herein, in accordance with various examples.
Figure 11A:
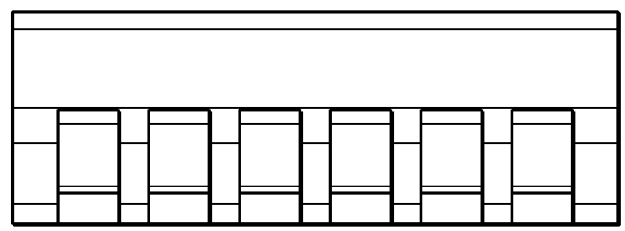
FIG. 11A is a side view of a semiconductor package having 12 metal contacts and formed by the processes described herein, in accordance with various examples.
Figure 11B:
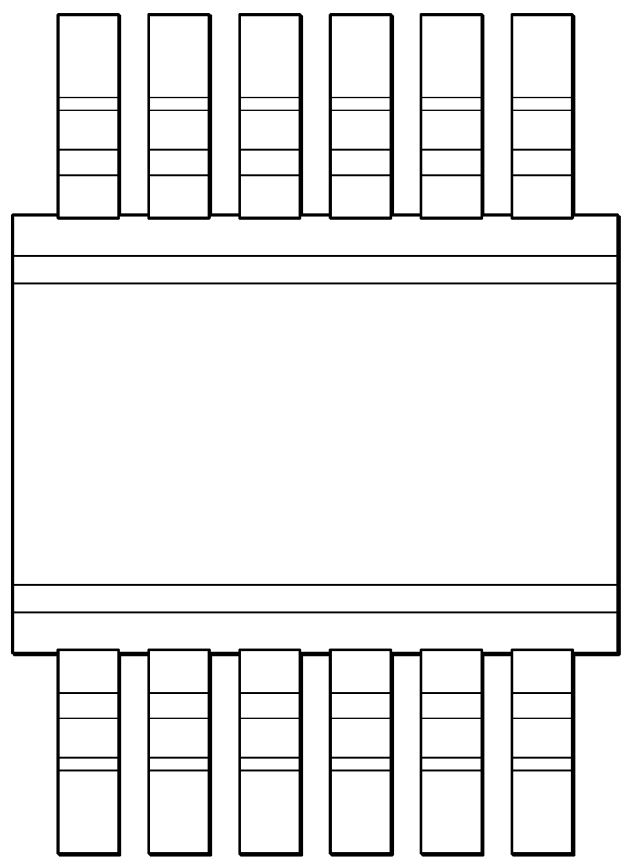
FIG. 11B is a top-down view of a semiconductor package having 12 metal contacts and formed by the processes described herein, in accordance with various examples.
Figure 11C:
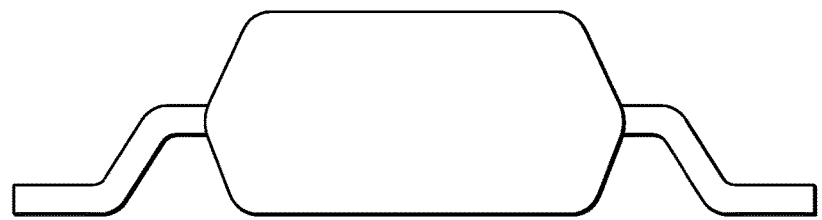
FIG. 11C is a front view of a semiconductor package having 12 metal contacts and formed by the processes described herein, in accordance with various examples.
Figure 11D:
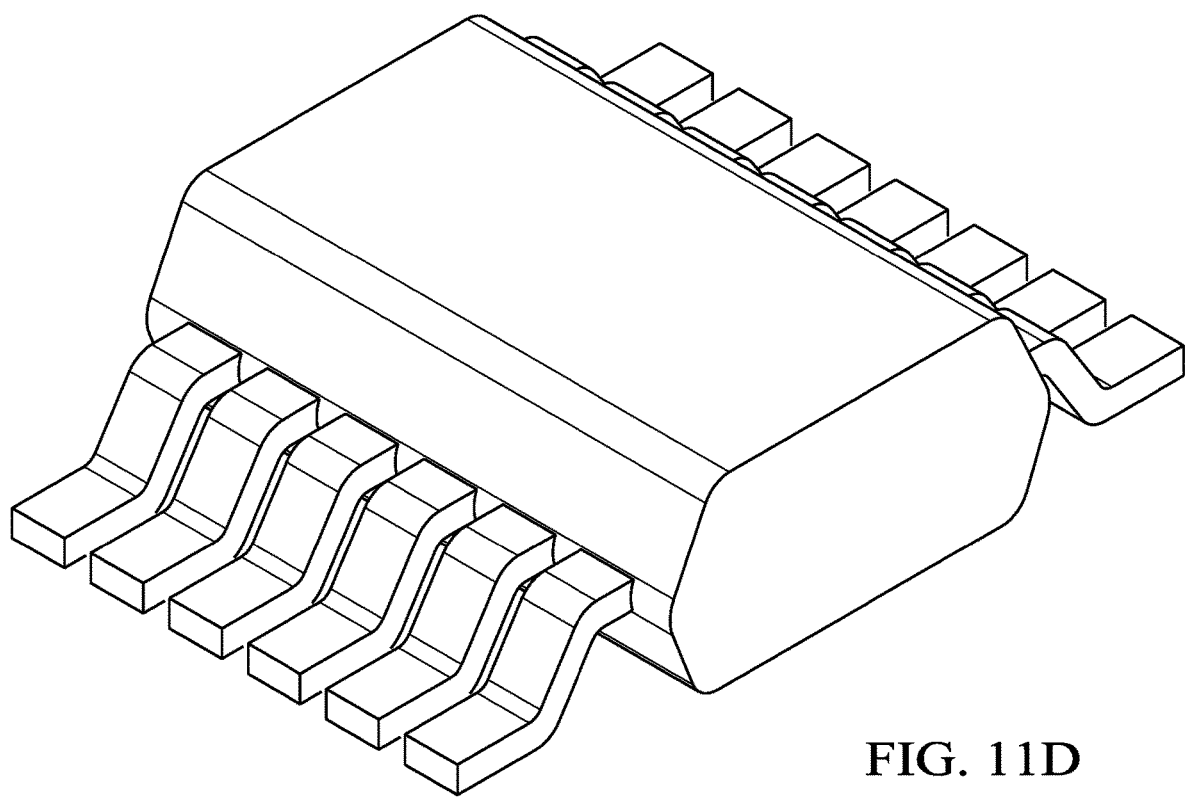
FIG. 11D is a perspective view of a semiconductor package having 12 metal contacts and formed by the processes described herein, in accordance with various examples.
Figure 11E:
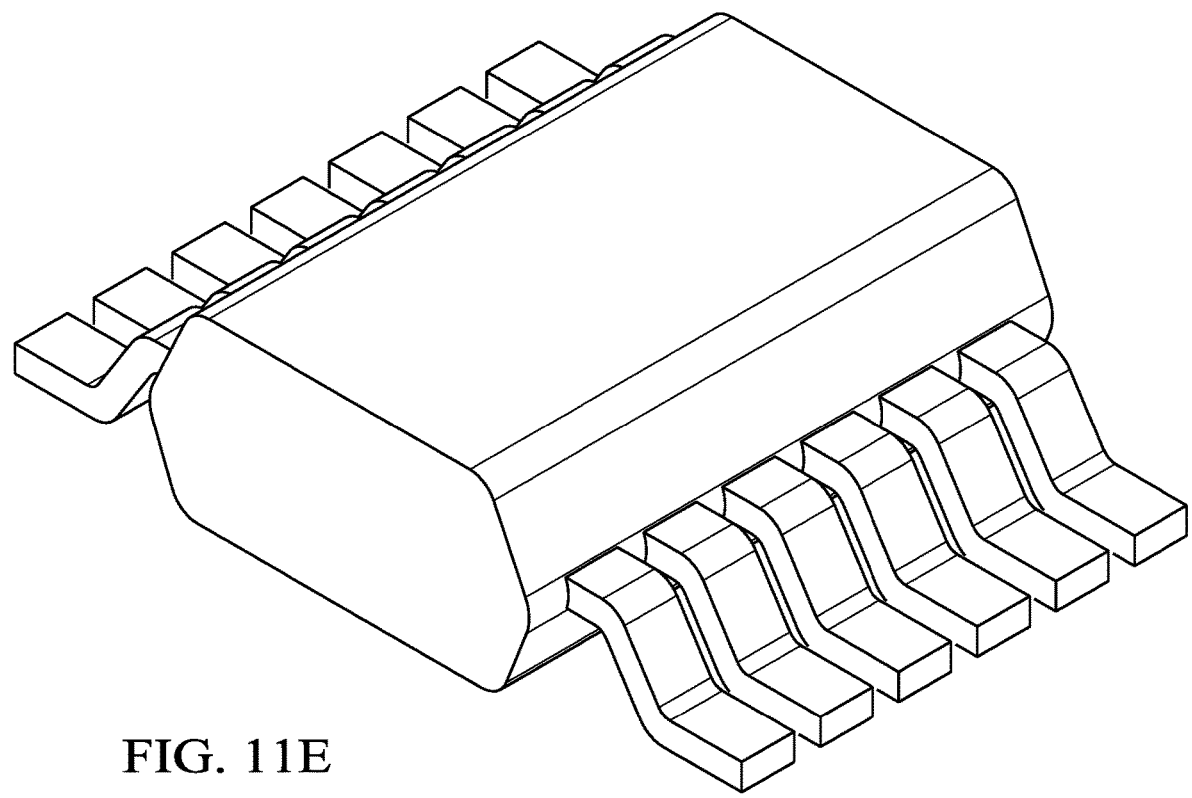
FIG. 11E is another perspective view of a semiconductor package having 12 metal contacts and formed by the processes described herein, in accordance with various examples.

FIG. 10D is a perspective view of the semiconductor package 1000. FIG. 10E is another perspective view of the semiconductor package 1000.

As alluded to above, the semiconductor die cavities described herein produce distinctive features of the semiconductor packages, such as the semiconductor package 1000. For example, and with reference to FIGS. 10A-10E, the angles between various surfaces of the package body 1002 may depend on the physical features of the semiconductor die cavities 102, 202 described above. Similarly, the smoothness or sharpness of edges between surfaces of the package body 1002 likewise may depend on the physical features of the semiconductor die cavities 102, 202. In at least some cases, the semiconductor die cavities 102, 202 are physically configured so that packages are produced as shown in FIGS. 10A-10E. In some examples, the edges 1004A, 1004B, 1012A, and 1012B are rounded edges, and in other examples, they are sharp edges. In some examples, the angles between the following pairs of surfaces are obtuse: surfaces 1016 and 1006A; surfaces 1018 and 1010A; surfaces 1016 and 1006B; surfaces 1018 and 1010B; surfaces 1006A and 1008A; surfaces 1008A and 1010A; surfaces 1006B and 1008B; and surfaces 1008B and 1010B.

In some examples, the angles between the end surface 1001A and all other surfaces (except for the opposing end surface 1001B) are approximately 90 degrees (i.e., approximately right angles). This is because singulation (e.g., sawing) of the continuous mold column 500 may be performed at right angles and because no part of the semiconductor die cavities affects these angles. (In at least some examples, the far opposing ends of the continuous mold column 500 are discarded after singulation.) Similarly, in some examples, the angles between the end surface 1001B and all other surfaces (except for the opposing end surface 1001A) are approximately 90 degrees (i.e., approximately right angles). This is because singulation (e.g., sawing) of the continuous mold column 500 may be performed at right angles and because no part of the semiconductor die cavities affects these angles.

In some examples, the edges between end surface 1001A and all other surfaces (except for the opposing end surface 1001B) are sharp (i.e., non-rounded) edges. This is because singulation (e.g., sawing) of the continuous mold column 500 may produce sharp edges. In other examples, these edges are rounded edges. Similarly, in some examples, the angles between the end surface 1001B and all other surfaces (except for the opposing end surface 1001A) are sharp (i.e., non-rounded) edges. In other examples, these edges are rounded edges. Sharp edges between any two surfaces may be used in tandem with right or non-right angles between those surfaces. Similarly, rounded edges between any two surfaces may be used in tandem with right or non-right angles between those surfaces.

FIGS. 11A-11E depict a semiconductor package produced by the same processes and the same semiconductor packaging molds 100, 200 as those used to produce the semiconductor package 1000. The semiconductor package depicted in FIGS. 11A-11E differs from the semiconductor package 1000 in that the package of FIGS. 11A-11E has 12 metal contacts instead of 8 metal contacts. The use of 8 and 12 metal contacts is merely illustrative; the processes and the semiconductor packaging molds described herein are flexible and may be used to package any number of semiconductor die having any number of metal contacts.

Figure 12:
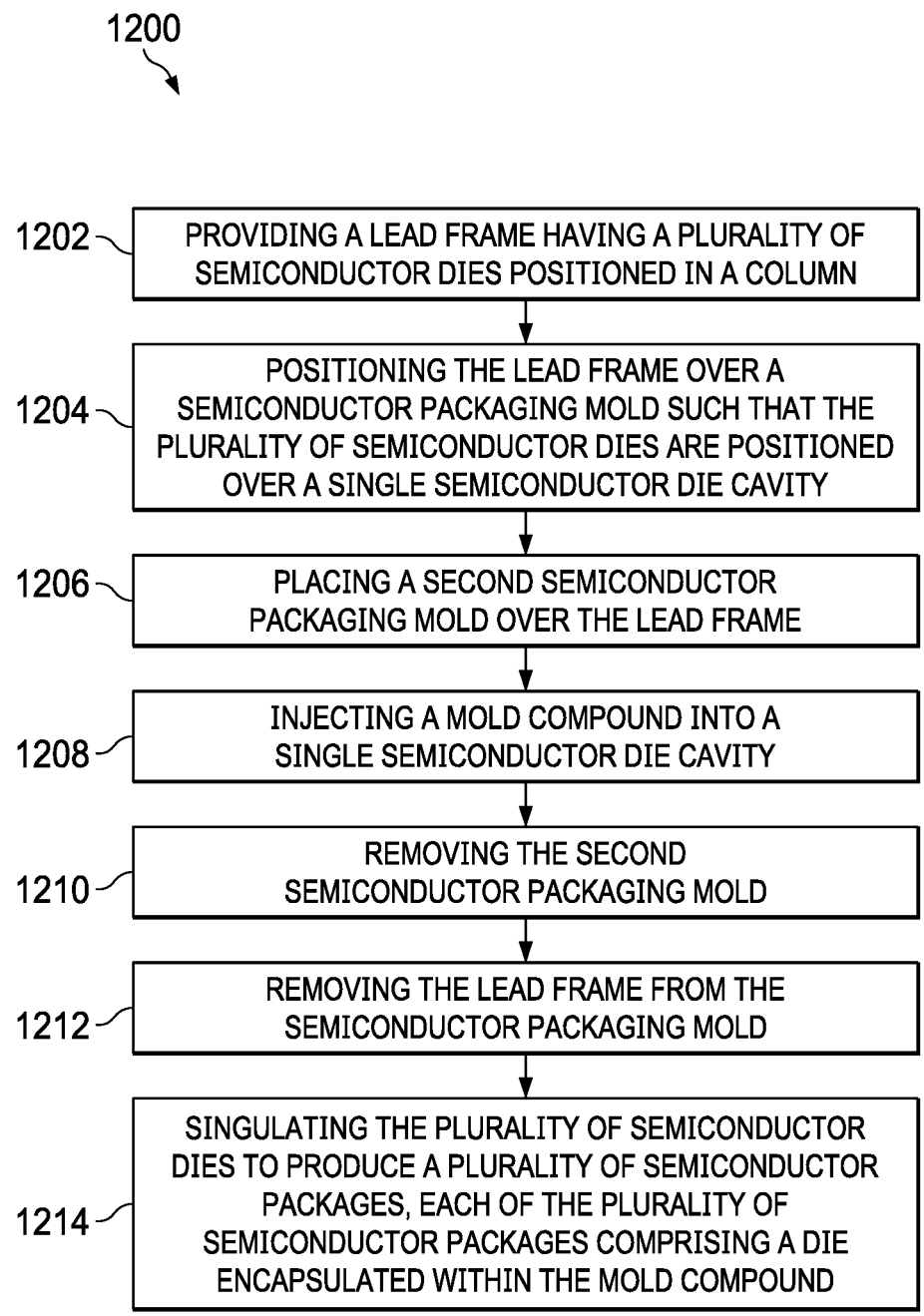
FIG. 12 is a flow diagram of a semiconductor package fabrication method in accordance with various examples.

FIG. 12 is a flow diagram of a semiconductor package fabrication method 1200 in accordance with various examples. The method 1200 depicts the steps described above to produce the illustrative semiconductor packages described above. The method 1200 begins by providing a lead frame having a plurality of semiconductor dies positioned in a column (step 1202). FIG. 4, for example, depicts this step. The method 1200 then comprises positioning the lead frame over a semiconductor packaging mold such that the plurality of semiconductor dies are positioned over a semiconductor die cavity (step 1204). FIG. 4, for example, depicts this step. The method 1200 further comprises placing a second semiconductor packaging mold over the lead frame (step 1206). FIGS. 2A and 2B depict an illustrative second semiconductor packaging mold. The method 1200 then includes injecting a mold compound into the semiconductor die cavity (step 1208). The apparatus depicted in FIGS. 1A, 1B, 3A, and 3B may be used to perform this step. The method 1200 further includes removing the second semiconductor packaging mold (step 1210), as FIG. 5 depicts. The method 1200 also comprises removing the lead frame from the semiconductor packaging mold (step 1212), as FIG. 6 depicts. The method 1200 comprises singulating the plurality of semiconductor dies to produce a plurality of semiconductor packages, each of the plurality of semiconductor packages comprising a semiconductor die encapsulated within the mold compound (step 1214), examples of which are depicted in FIGS. 10A-11E.

Figure 13:
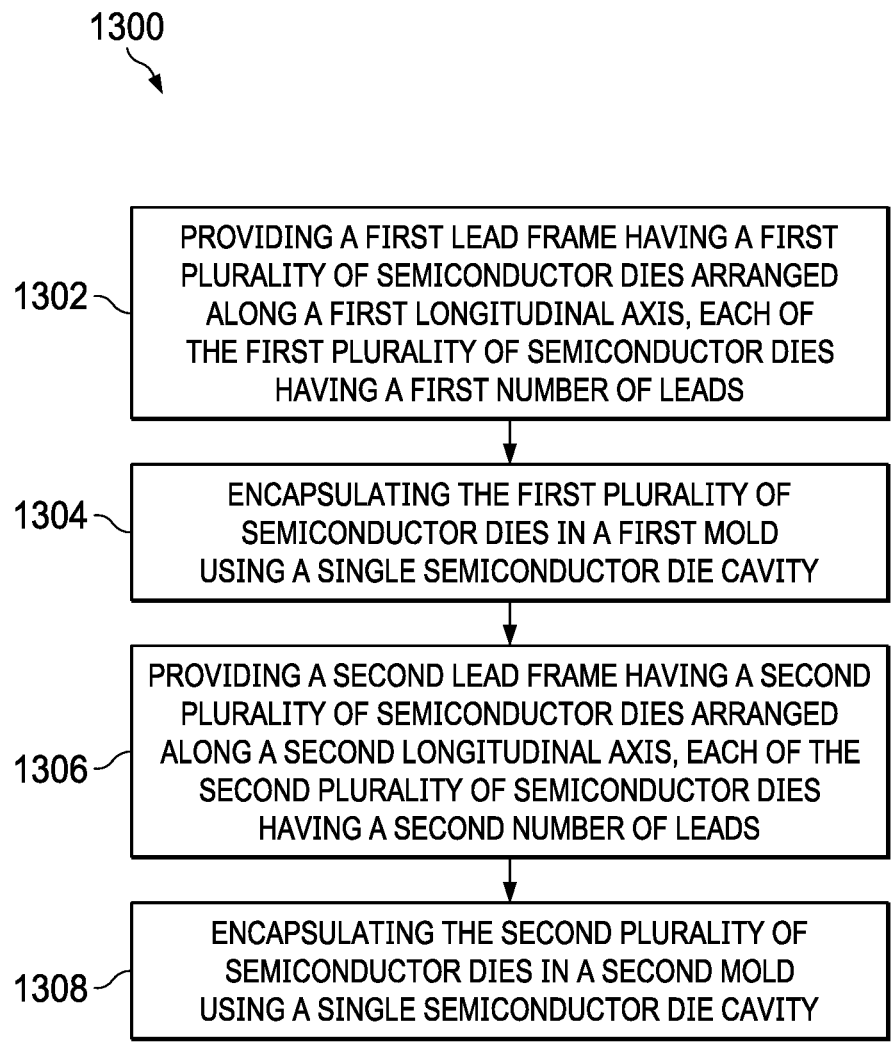
FIG. 13 is a flow diagram of a semiconductor package fabrication method in accordance with various examples.

FIG. 13 is a flow diagram of a semiconductor package fabrication method 1300 in accordance with various examples. The method 1300 depicts the steps described above to produce the illustrative semiconductor packages described above. The method 1300 begins by providing a first lead frame having a first plurality of semiconductor dies arranged along a first longitudinal axis, each of the first plurality of semiconductor dies having a first number of metal contacts (step 1302). FIG. 4, for example, depicts this step. The method 1300 also comprises encapsulating the first plurality of semiconductor dies in a first mold using a common semiconductor die cavity (step 1304). FIGS. 4 and 5, for example, depict this step. The method 1300 further includes providing a second lead frame having a second plurality of semiconductor dies arranged along a second longitudinal axis, each of the second plurality of semiconductor dies having a second number of metal contacts (step 1306). FIG. 4, for example, depicts this step. The method 1300 further comprises encapsulating the second plurality of semiconductor dies in a second mold using the common semiconductor die cavity (step 1308). FIGS. 4 and 5, for example, depict this step. FIGS. 10A-11E depict illustrative semiconductor packages (with differing metal contact quantities) that may be produced by the steps of the method 1300 of FIG. 13.

In the foregoing discussion and in the claims, the terms "including" and "comprising" are used in an open-ended fashion, and thus should be interpreted to mean "including, but not limited to . . . ." Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method of forming a semiconductor package, comprising:
    providing a first lead frame having a first plurality of semiconductor dies arranged along a first longitudinal axis, each of the first plurality of semiconductor dies having a first number of metal contacts;
    providing a second lead frame having a second plurality of semiconductor dies arranged along a second longitudinal axis, each of the second plurality of semiconductor dies having a second number of metal contacts, the second number of metal contacts different than the first number of metal contacts;
    covering the first plurality of semiconductor dies in a first mold using a common semiconductor die cavity; and
    covering the second plurality of semiconductor dies in a second mold using the common semiconductor die cavity.

2. The method of claim 1, further comprising singulating the first mold to produce a first plurality of semiconductor packages, each of the first plurality of semiconductor packages comprising a different one of the first plurality of semiconductor dies.

3. The method of claim 1, further comprising singulating the second mold to produce a second plurality of semiconductor packages, each of the second plurality of semiconductor packages comprising a different one of the second plurality of semiconductor dies.

4. The method of claim 2, wherein each of the first plurality of semiconductor packages includes:
   a first side surface having a first set of metal contacts extending therefrom;
   a second side surface having a second set of metal contacts extending therefrom;
   a top surface;
   a bottom surface; and
   a first end surface meeting at least one of the first side surface, the second side surface, the top surface, and the bottom surface at a first set of non-rounded edges.

5. The method of claim 3, wherein each of the second plurality of semiconductor packages includes:
   a first side surface having a first set of metal contacts extending therefrom;
   a second side surface having a second set of metal contacts extending therefrom;
   a top surface;
   a bottom surface; and
   a first end surface meeting at least one of the first side surface, the second side surface, the top surface, and the bottom surface at a first set of non-rounded edges.

6. The method of claim 4, further comprising a second end surface opposite the first end surface, the second end surface meeting at least one of the first side surface, the second side surface, the top surface, and the bottom surface at non-rounded edges.

7. The method of claim 5, further comprising a second end surface opposite the first end surface, the second end surface meeting at least one of the first side surface, the second side surface, the top surface, and the bottom surface at non-rounded edges.

8. The method of claim 4, wherein the first end surface forms an approximately 90 degree angle with at least one of the first side surface, the second side surface, the top surface, and the bottom surface.

9. The method of claim 5, wherein the first end surface forms an approximately 90 degree angle with at least one of the first side surface, the second side surface, the top surface, and the bottom surface.

10. The method of claim 4, wherein the first end surface forms an angle greater than 90 degrees with at least one of the first side surface, the second side surface, the top surface, and the bottom surface.

11. The method of claim 5, wherein the first end surface forms an angle greater than 90 degrees with at least one of the first side surface, the second side surface, the top surface, and the bottom surface.

12. The method of claim 2, wherein the first plurality of semiconductor packages comprises gullwing leads.

13. The method of claim 3, wherein the second plurality of semiconductor packages comprises gullwing leads.

14. A semiconductor packaging system, comprising:
   a semiconductor packaging mold, comprising:
      a mold compound storage cavity;
      a plurality of semiconductor die cavities, each semiconductor die cavity configured to accommodate multiple semiconductor dies along a longitudinal axis of the semiconductor die cavity and further configured to accommodate a mold compound such that the mold compound abuts the multiple semiconductor dies; and
      a plurality of runner cavities extending from the mold compound storage cavity to the plurality of semiconductor die cavities, wherein each of the plurality of semiconductor die cavities includes a pair of surfaces meeting at an angle less than 90 degrees.

15. The system of claim 14, further comprising a second semiconductor packaging mold comprising a second plurality of semiconductor die cavities.

16. The system of claim 14, wherein each of the plurality of semiconductor die cavities includes rounded edges.

* * * * *